US011862697B2

(12) United States Patent
Ping et al.

(10) Patent No.: US 11,862,697 B2
(45) Date of Patent: Jan. 2, 2024

(54) METHOD FOR MANUFACTURING BURIED GATE AND METHOD FOR MANUFACTURING SEMICONDUCTOR DEVICE

(71) Applicant: CHANGXIN MEMORY TECHNOLOGIES, INC., Hefei (CN)

(72) Inventors: Er-Xuan Ping, Hefei (CN); Jie Bai, Hefei (CN); Mengmeng Yang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 252 days.

(21) Appl. No.: 17/371,184

(22) Filed: Jul. 9, 2021

(65) Prior Publication Data

US 2021/0343846 A1 Nov. 4, 2021

Related U.S. Application Data

(63) Continuation of application No. PCT/CN2021/075109, filed on Feb. 3, 2021.

(30) Foreign Application Priority Data

Apr. 30, 2020 (CN) ........................ 202010365052.4

(51) Int. Cl.
*H01L 29/423* (2006.01)
*H01L 21/762* (2006.01)
(Continued)

(52) U.S. Cl.
CPC .... *H01L 29/4236* (2013.01); *H01L 21/02634* (2013.01); *H01L 21/76224* (2013.01); (Continued)

(58) Field of Classification Search
CPC ........... H01L 29/42356; H01L 29/4236; H01L 21/02634; H10B 12/053; H10B 12/34
See application file for complete search history.

(56) References Cited

U.S. PATENT DOCUMENTS 7,029,989 B2 4/2006 Kim
7,612,406 B2 11/2009 Kluge
(Continued)

FOREIGN PATENT DOCUMENTS

CN 101140950 A 3/2008
CN 104103516 A 10/2014
(Continued)

OTHER PUBLICATIONS

Supplementary European Search Report in European application No. 21773282.5, dated Jun. 13, 2022, 8 pgs.
(Continued)

*Primary Examiner* — Joseph C. Nicely
(74) *Attorney, Agent, or Firm* — Cooper Legal Group, LLC

(57) ABSTRACT

A method for manufacturing a buried gate and a method for manufacturing a semiconductor device are disclosed. The method for manufacturing the buried gate includes that: a trench is provided on an active region of a substrate; a gate structure is filled in a bottom of the trench, and a trench sidewall above the gate structure is exposed; an epitaxial layer is grown on the exposed trench sidewall with an epitaxial growth process, in which the epitaxial layer does not close the trench; and an isolation layer is filled in the trench.

20 Claims, 13 Drawing Sheets

140′
110′
W2′
H1′
W1′
100′

(51) Int. Cl.
*H10B 12/00* (2023.01)
*H01L 21/02* (2006.01)
*H01L 29/40* (2006.01)

(52) U.S. Cl.
CPC ..... *H01L 29/42356* (2013.01); *H10B 12/053* (2023.02); *H10B 12/34* (2023.02); *H01L 29/401* (2013.01)

(56) References Cited

U.S. PATENT DOCUMENTS 7,763,514 B2 7/2010 Von Kluge
7,867,841 B2 1/2011 Lim
9,305,823 B2 4/2016 Zhao
9,601,568 B2 3/2017 Zhao
10,615,164 B2 4/2020 Kim et al.
11,652,170 B2 * 5/2023 Chen .................. H01L 29/7827 257/330
2004/0070023 A1 4/2004 Kim
2008/0061320 A1 3/2008 Von Kluge
2008/0061322 A1 3/2008 Von Kluge
2008/0157262 A1 7/2008 Lim
2011/0024815 A1 2/2011 Kim
2014/0291799 A1 10/2014 Zhao
2016/0172440 A1 6/2016 Zhao
2019/0051652 A1 2/2019 Kim et al.
2019/0259839 A1 * 8/2019 Ryu ...................... H01L 21/324
2020/0091303 A1 * 3/2020 Nam ................. H01L 29/42368
2020/0219885 A1 7/2020 Kim et al.
2021/0249417 A1 8/2021 Kim et al.

FOREIGN PATENT DOCUMENTS

CN 109390340 A 2/2019
CN 106992156 B 9/2019
CN 110911476 A 3/2020
CN 113451395 A 9/2021

OTHER PUBLICATIONS

International Search Report in the international application No. PCT/CN2021/075109, dated May 8, 2021, 2 pgs.

* cited by examiner

METHOD FOR MANUFACTURING BURIED GATE AND METHOD FOR MANUFACTURING SEMICONDUCTOR DEVICE

CROSS-REFERENCE TO RELATED APPLICATION

The present application is a U.S. continuation application of International Application No. PCT/CN2021/075109, filed on Feb. 3, 2021, which claims priority to Chinese Patent Application No. 202010365052.4, filed on Apr. 30, 2020. Both of the applications are entitled "METHOD FOR MANUFACTURING BURIED GATE AND METHOD FOR MANUFACTURING SEMICONDUCTOR DEVICE". International Application No. PCT/CN2021/075109 and Chinese Patent Application No. 202010365052.4 are hereby incorporated by reference in their entireties.

TECHNICAL FIELD

The disclosure relates to a method for manufacturing a buried gate and a method for manufacturing a semiconductor device.

BACKGROUND

During manufacture of transistors, the level of integration for chips is improved by forming buried gates. The buried gate is formed by providing a trench in a substrate and filling a gate structure in the trench.

With further improvements of requirements on the level of integration, a width of a trench in which the gate structure is filled is increasingly narrower.

SUMMARY

According to various examples, an aspect of the disclosure provides a method for manufacturing a buried gate, which includes the following operations.

A trench is provided on an active region of a substrate.

A gate structure is filled in a bottom of the trench, and a trench sidewall above the gate structure is exposed.

An epitaxial layer is grown on the exposed trench sidewalls with an epitaxial growth process, which does not close the trench.

An isolation layer is filled in the trench.

Another aspect of the disclosure provides a method for manufacturing a semiconductor device, which includes the following operations.

A gate structure is manufactured on a substrate with the above method for manufacturing the buried gate.

An active region on each of two sides of the gate structure is doped to form a source/drain region.

Details of one or more examples of the present application are proposed in the following accompanying drawings and descriptions. Other features and advantages of the disclosure will be apparent in the descriptions, accompanying drawings and claims.

BRIEF DESCRIPTION OF THE DRAWINGS

To illustrate the technical solutions in the examples of the disclosure more clearly, the accompanying drawings for describing the examples are introduced briefly in the following. Apparently, the accompanying drawings in the following description are only about some examples of the disclosure, and those of ordinary skill in the art can derive other drawings from these accompanying drawings without creative efforts.

REFERENCE SIGNS OF THE ELEMENTS

Substrate: 100; active region: AA; trench: 101; isolation structure: 110; first isolation layer: 111; second isolation layer: 112; third isolation layer: 113; protective layer: 130; isolation layer: 140; gate structure: 120; dielectric layer: 121; metal nitride layer: 122; first conductive layer: 123; polysilicon layer: 124; epitaxial layer: 102; height of the gate conductive layer: H1; width of the gate conductive layer: W1; and width of the active region on a side of the trench: W2.

DETAILED DESCRIPTION

When the width of the trench is reduced to a certain extent, it is hard to fill the gate structure in the trench. Meanwhile, while the width of the trench is reduced, the width of the gate structure is reduced, which results in that the resistance of the gate conductive layer is increased and the electrical performance of the transistor is decreased.

For the ease of understanding the disclosure, the disclosure is described more completely with reference to related accompanying drawings. Preferred examples of the disclosure are given in the accompanying drawings. However, the disclosure may be implemented in many different forms and is not limited to the examples described herein. Conversely, these examples are provided to make the disclosures of the disclosure more thoroughly and completely.

Unless otherwise defined, all technical and scientific terms used in the specification have a same meaning generally understood by a person skilled in the art to which the disclosure belongs. The terms used in the specification of the disclosure are merely to describe the specific examples, rather than to limit the disclosure. The term "and/or" used herein includes one or any or all possible combinations of multiple associated items that are listed.

Figure 1:
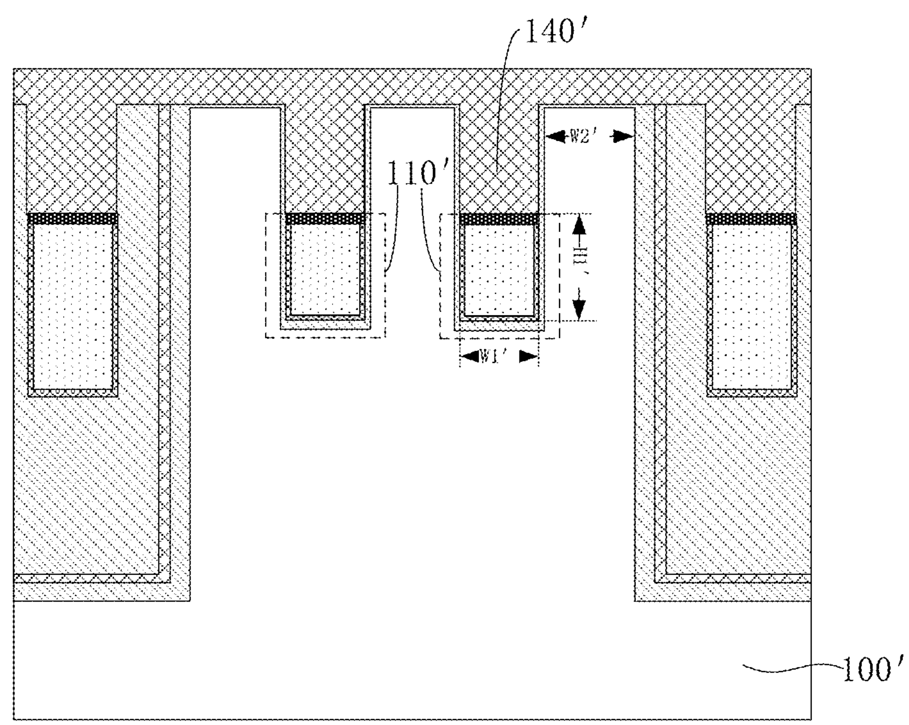
FIG. 1 illustrates a structural schematic diagram after a buried gate is manufactured in a substrate according to the conventional technique.

In the conventional art, as shown in FIG. 1, the process for forming the buried gate on the substrate 100' includes that: a trench is provided on the substrate 100', a gate structure 110' is filled in a bottom of the trench, and then an isolation layer 140' is directly deposited to fully fill the trench above the gate structure 110'. For the buried gate formed in the conventional art, the gate conductive layer has a width of W1', and a height of H1'. According to the resistance formula $R=\rho*L/(W*H)$, the resistance of the gate conductive layer is inversely proportional to the width of the gate conductive layer. Therefore, the narrower the opening of the trench, and the narrower the gate conductive layer, thereby the larger the resistance.

In view of this, the disclosure relates to a method for manufacturing a buried gate. The method for manufacturing the buried gate may at least include the following several steps.

A trench is provided on an active region of a substrate.

A gate structure is filled in a bottom of the trench, and a trench sidewall above the gate structure is exposed.

An epitaxial layer is grown on the exposed trench sidewall with an epitaxial growth process, which does not close the trench.

An isolation layer is filled in the trench.

According to the method for manufacturing the buried gate, the trench is provided on the substrate, the trench may be divided into a bottom trench and a top trench that are communicated to each other, and the gate structure is filled in the bottom groove but not in the top groove, such that the top trench sidewall is exposed, and the epitaxial layer is grown on the top trench sidewall with an epitaxial growth technique. In the disclosure, the trench having an opening with a large width may be first provided on the substrate, in which the gate structure is filled; and after the gate structure is filled, the epitaxial layer is grown on the top trench sidewall with the epitaxial growth technique. The width of the active region at each of two sides of the gate structure is increased by the epitaxial layer. In the disclosure, the trench having the large opening is first provided in which the gate structure is filled, and then the width of the opening of the trench above the gate structure is reduced by the epitaxial growth technique. Compared with the conventional art in which the trench having a small opening is directly provided, when area of the active region on each of the two sides of the trench are unchanged, and the depth of the trench and the length of the trench are unchanged, the width of the buried gate formed in the disclosure is increased, i.e., the width of the gate conductive layer is increased, and the resistance of the gate conductive layer is reduced, such that the manufactured buried gate has good electrical performance.

The method for manufacturing the buried gate in the disclosure will be described below in detail with specific examples.

Figure 2:
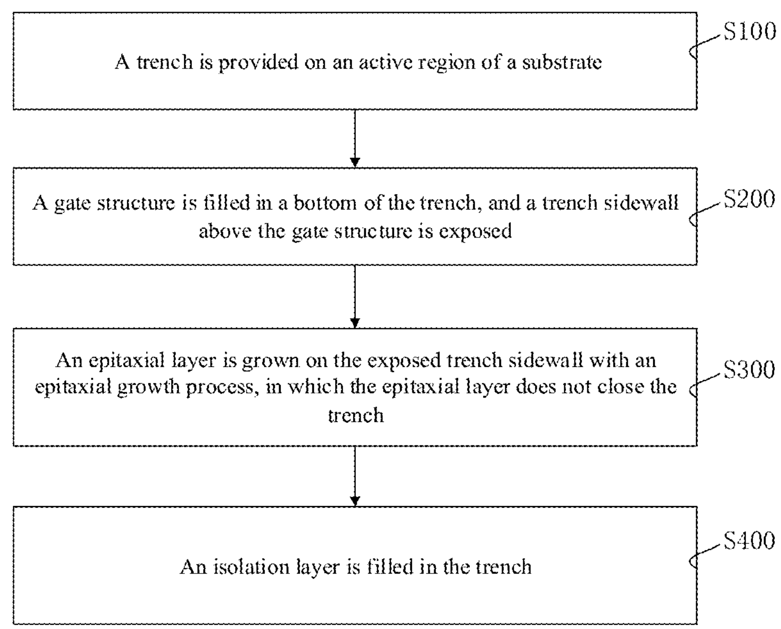
FIG. 2 illustrates a flowchart of steps of a method for manufacturing a buried gate according to an example.

As shown in FIG. 2, the method for manufacturing the buried gate in the disclosure may include the following steps.

In Step S100: a trench is provided on an active region of a substrate.

Figure 3:
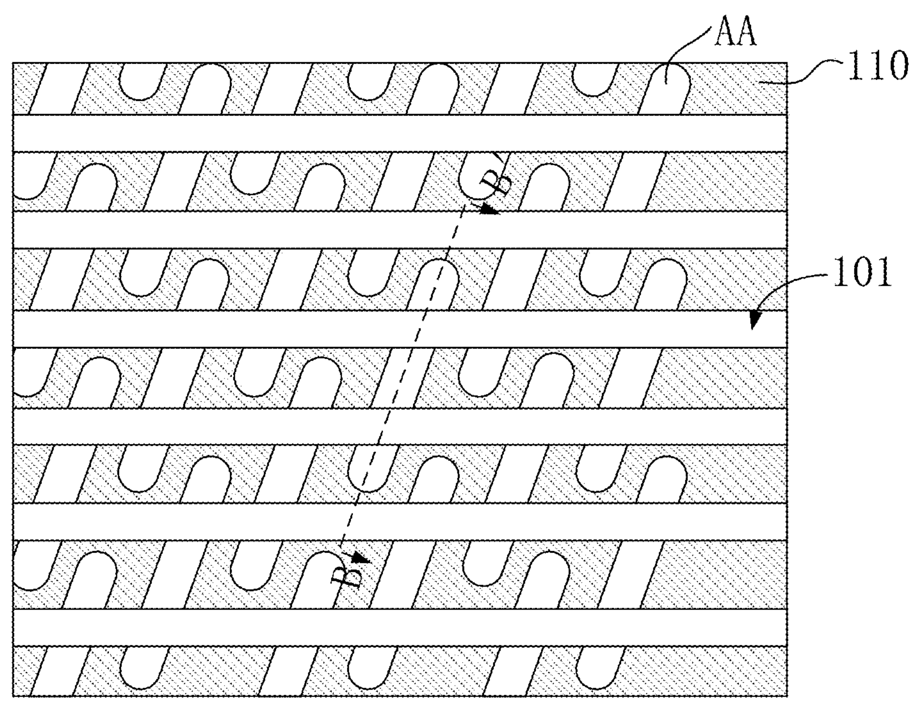
FIG. 3 illustrates a top view of a trench penetrating through an active region according to an example.
Figure 4A:
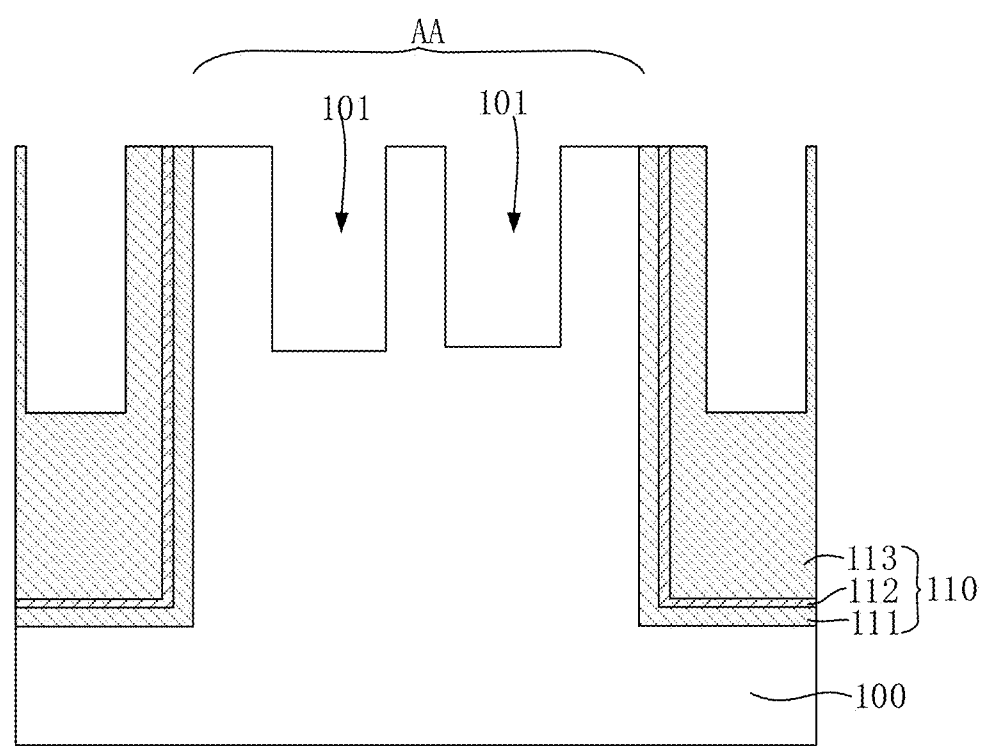
FIG. 4*a* to FIG. 4*g* illustrate a structural schematic diagram corresponding to the related steps of a method for manufacturing a buried gate according to an example.

As shown in FIG. 3 and FIG. 4*a*, FIG. 4*a* is a side sectional view along a BB' section line in FIG. 3. The active region AA is defined on the substrate 100, and the trench 101 is provided on the active region AA. Specifically, there may be one trench 101, and may also be multiple parallel trenches 101, which may have the same size or different sizes. The trench 101 in the active region AA may extend along a direction parallel to a surface of the substrate 100 (a length direction of the trench) to two sides to penetrate through the active region AA.

The substrate 100 may be one of a silicon wafer, a germanium wafer, a silicon-on-insulator (SOI) wafer, a germanium-on-insulator (GOI) wafer, a silicon-germanium wafer and a substrate formed with an epitaxial layer 102. In this example, the substrate 100 uses the silicon wafer.

Specifically, the trench is provided on the substrate 100, which may be implemented by first forming a mask layer on the substrate 100, defining an etching pattern with the mask layer, and then etching the substrate 100 by an etching process to provide the trench. The mask layer may be a hard mask, and may specifically use silicon nitride or silicon oxide. Specifically, the trench may be formed with a self-aligned quadruple patterning (SAQP) process. With the technique of SAQP, the small-sized structure may be obtained.

In an example, an isolation structure 110 is further formed on the substrate 100. The isolation structure 110 is formed by filling a dielectric layer in an isolation trench. Adjacent active regions AA are electrically isolated by the isolation structure 110. Specifically, before Step S100, the isolation structure 110 may be formed on the substrate 100 and the active region AA may be defined by the isolation structure 110. The isolation structure 110 may be the silicon nitride or the silicon oxide, and may also be a composite structure of the silicon nitride and the silicon oxide. In the example, the isolation structure 110 includes a first isolation layer 111 formed on an inner wall of the isolation trench, a second isolation layer 112 covering the first isolation layer 111 and a third isolation layer 113 covering the second isolation layer 112 and fully filling the isolation trench. The first isolation layer 111 and the third isolation layer 113 may be silicon oxide, the second isolation layer 112 may be silicon nitride, and thus the isolation structure 110 is of a silicon oxide-silicon nitride-silicon oxide composite isolation structure. In an example, while the trench is provided on the active region AA, a trench is also correspondingly provided on the isolation structure 110, and while the trench on the active region AA is filled with the following steps, the trench on the isolation structure 110 is also filled with the same steps.

In Step S200: a gate structure is filled in a bottom of the trench, and a trench sidewall above the gate structure is exposed.

The gate structure is filled in the bottom of the trench with a preset thickness. The gate structure does not fully fill the trench. The trench portion filled with the gate structure is defined as the bottom trench, and the trench portion above the bottom trench is defined as the top trench. By this time, the gate structure is only filled in the bottom trench but does not filled in the top trench, thereby forming the buried gate. After the gate structure is formed, there is a need to expose the trench sidewalls above the gate structure outside.

In an example, the gate structure is filled in the bottom of the trench, which may include the following steps.

In Step S211: a dielectric layer is formed on an inner wall of the trench.

Figure 4B:
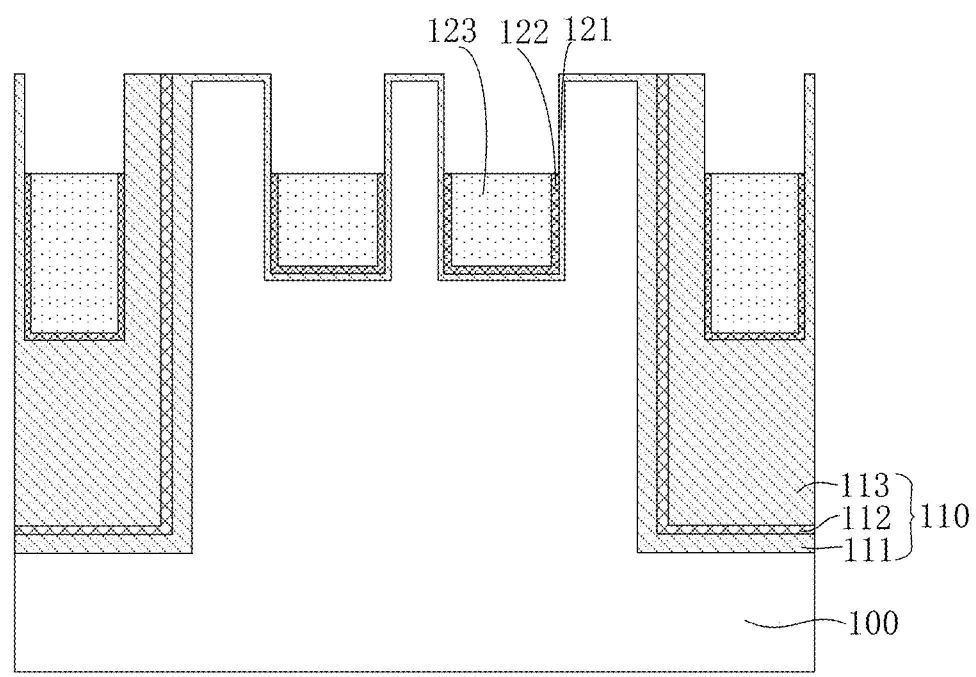

As shown in FIG. 4*b*, the dielectric layer 121 is formed on the inner wall of the trench, with which the gate dielectric layer is formed.

In an example, the dielectric layer 121 may be formed by using a deposition process. The dielectric layer 121 shape-retaining covers the exposed surface. The so-called "shape-retaining coverage" refers to that the thickness of the dielectric layer 121 is uniform and consistent. As shown in FIG. 4*b*, the dielectric layer 121 is respectively formed on the inner wall of the trench, on the substrate 100 out of the trench and on the isolation structure 110. The deposition process may specifically use chemical vapor deposition (CVD) or atomic layer deposition (ALD). The CVD may use plasma enhancing CVD (PECVD), and may also use other appropriate deposition process. Specifically, the formed dielectric layer 121 may be an oxide, and may also be a nitride.

In another example, the dielectric layer 121 may also be formed by using a thermal oxidation process. With the thermal oxidation process, an oxide layer may be formed on the surface of the exposed substrate 100 and on the inner wall of the trench. Therefore, the oxide layer formed on the inner wall of the trench and on the surface of the substrate 100 out of the trench may serve as the dielectric layer 121.

In an example, as shown in FIG. 4*b*, after the dielectric layer 121 is formed on the inner wall of the trench, and before Step S220, the method further includes that: a metal nitride layer 122 is formed on the dielectric layer 121. Specifically, the metal nitride layer 122 includes titanium nitride.

In Step S212: a first conductive layer is filled in the trench, and the first conductive layer is back-etched to a preset depth.

Further referring to FIG. 4*b*, the first conductive layer 123 is filled in the trench. Specifically, the first conductive layer 123 may be deposited with a deposition process. The deposition process may also be the above described any deposition process. The first conductive layer 123 deposited herein is relatively thick, thus it overflows from the trench for a certain height after fully filling the trench. Further, the step that the first conductive layer 123 is back-etched includes that: first, the first conductive layer 123 is ground with a grinding process to remove the first conductive layer 123 out of the trench, and then the first conductive layer 123 in the trench is etched to a preset depth with a dry etching process. Thus, the gate structure 120 includes the first conductive layer 123 and the dielectric layer 121 clamped between the first conductive layer 123 and the inner wall of the trench, in which the first conductive layer 123 serves as the gate conductive layer, and the portion of the dielectric layer 121 clamped between the first conductive layer 123 and the inner wall of the trench is the gate dielectric layer.

In an example, the first conductive layer 123 uses a metal having good conductivity. For example, tungsten, molybdenum, cobalt, ruthenium, copper, silver, aluminum, tungsten-copper alloy, graphene and the like may be used as low-resistivity materials. The first conductive layer 123 may use a material selected from the above materials but is not limited thereto. It may also use other appropriate conductive material.

In an example, when the metal nitride layer 122 is further formed on the dielectric layer 121, after the first conductive layer 123 is filled, both the first conductive layer 123 and the metal nitride layer 122 are back-etched to a preset depth. Specifically, the first conductive layer 123 and the metal nitride layer 122 may be back-etched to the preset depth at the same time, such that upper surface of the first conductive layer 123 and the metal nitride layer 122 are flush.

In an example, after the first conductive layer 123 is back-etched, the dielectric layer 121 may also be further back-etched to the preset depth, to remove the dielectric layer 121 other than that in the gate structure 120. In another example, after the first conductive layer 123 is back-etched, the dielectric layer 121 is not back-etched, but retained on the trench sidewall above the gate structure 120 and on the surface of the substrate 100 out of the trench.

Figure 4C:
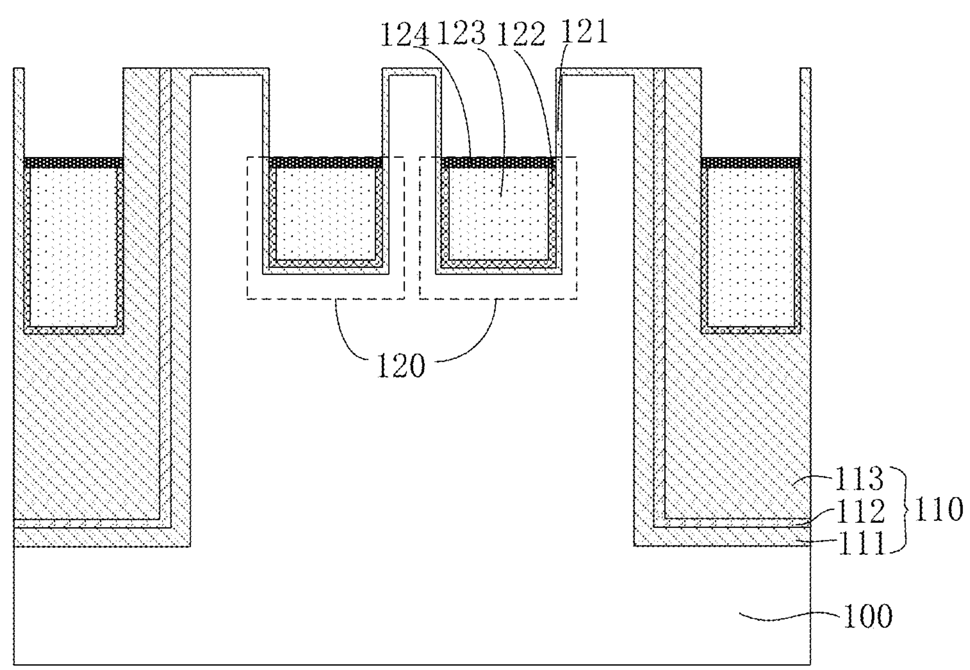

In an example, when the first conductive layer 123 is metal, after the first conductive layer 123 is back-etched to the preset depth, the method may further include that: a polysilicon layer 124 covering the first conductive layer 123 is formed in the trench, which does not fully fill the trench. At this time, the gate structure 120 includes the polysilicon layer 124, the first conductive layer 123, the metal nitride layer 122 and the dielectric layer 121 clamped between the metal nitride layer 122 and the inner wall of the trench. During the specific process, the relatively thick polysilicon layer 124 may be deposited in the trench with the deposition process, and then the polysilicon layer 124 is back-etched to a target thickness. At this time, as shown in FIG. 4*c*, the polysilicon layer 124 covers the first conductive layer 123 and does not fully fill the trench. In this example, by forming the polysilicon layer 124 on the first conductive layer 123, the polysilicon layer 124 has a small work function, thus may reduce the gate-induced leakage. In other examples, materials such as Al, Ta, Nb and Zr may also be used to replace the polysilicon layer 124.

In an example, after the gate structure 120 is filled in the bottom of the trench, the method may further include the following step.

In Step S220: a protective layer covering the upper surface of the gate structure and exposing the trench sidewall above the gate structure is formed.

In an example, Step S220 may be divided into the following sub-steps.

In Step S221: a protective layer covering the trench sidewall, an upper surface of the gate structure and an upper surface of the substrate out of the trench is formed.

Figure 4D:
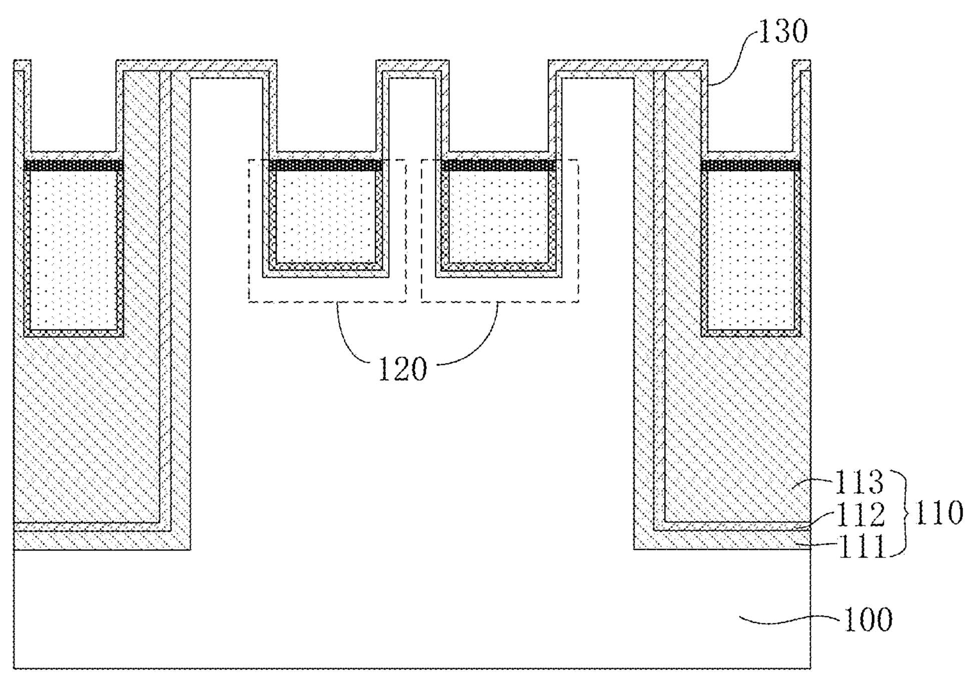

As shown in FIG. 4*d*, the protective layer 130 with an uniform thickness is deposited on the structural surfaces in the trench and out of the trench with a deposition process. At this time, the protective layer 130 shape-retaining covers the trench sidewall, the upper surface of the gate structure 120 and the upper surface of the substrate 100 out of the trench. Specifically, the deposition process is the ALD process.

In Step S222: with an etching process, the protective layer on the trench sidewall is removed and the protective layer covering the upper surface of the gate structure is retained.

Figure 4E:
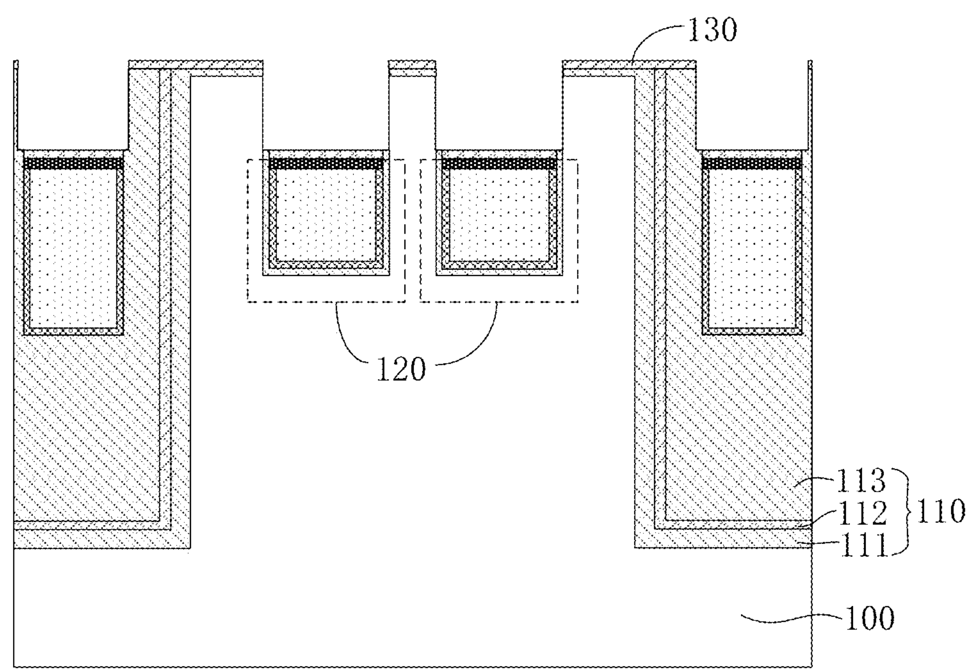
Figure 5A:
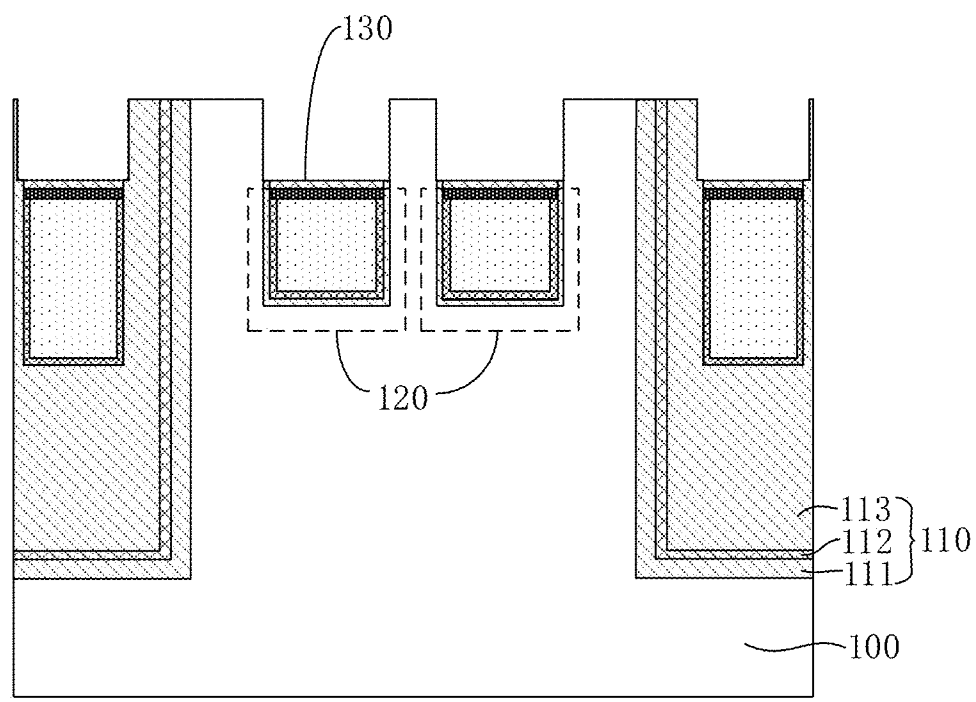
FIG. 5*a* to FIG. 5*c* illustrate a structural schematic diagram corresponding to the related steps for growing an epitaxial layer on trench sidewalls according to another example.

In an example, the etching process is lateral etching. As shown in FIG. 4*e*, after the protective layer 130 is deposited, the protective layer 130 is laterally etched to remove the protective layer 130 on the trench sidewall, meanwhile retain the protective layers 130 on the upper surface of the gate structure 120 and on the upper surface of the substrate 100 out of the trench, such that only the substrate on the trench sidewall is exposed, therefore, in the subsequent epitaxial growth process, the epitaxial layer is only formed on the trench sidewalls. In other examples, as shown in FIG. 5*a*, the protective layer on the trench sidewall and on the upper surface of the substrate out of the trench may be removed together, while only the protective layer 130 on the upper surface of the gate structure 120 is retained, such that the trench sidewall and the substrate out of the trench are exposed at the same time, therefore, in the subsequent epitaxial growth process, the epitaxial layer is formed on the trench sidewall and the substrate out of the trench at the same time; and after the epitaxial growth, the excessive epitaxial layer out of the trench may be removed with the grinding process.

The lateral etching may be wet etching which as a relatively larger etching rate to the sidewall. For example, after the substrate 100 is placed into an etchant, an external electric field is applied to a space where the etchant is present. Depending on the applied external electric field, corrosive negative ions and/or positive ions in the etchant are driven to a direction to be etched. In the example, the direction to be etched is a horizontal direction (lateral) toward the trench sidewall. By controlling the direction of the wet etching, the etching selectivity of the wet etching is improved. The protective layer 130 on the trench sidewall is etched, whereas the degree of etching on the protective layers 130 covering the upper surface of the gate structure 120 and the upper surface of the substrate 100 is relatively low, such that after the protective layer 130 on the trench sidewall is etched completely and the trench sidewall are exposed, the upper surface of the gate structure 120 and the upper surface of the substrate 100 are still covered by the protective layers 130. Specifically, the protective layer 130 may be silicon nitride or silicon oxide, and may also be other appropriate dielectric material.

In an example, when only the protective layer 130 is formed on the trench sidewall, by just removing the protective layer 130 on the sidewall the trench sidewall can be exposed. In another example, when other structure is clamped between the trench sidewall and the protective layer, after the protective layer 130 is removed, the other structure on the sidewall is exposed, and the exposed other structure needs to be further etched till the trench sidewall themselves are exposed. For example, when the gate structure 120 is manufactured, the formed dielectric layer 121, that covers the inner wall of the trench and the upper surface of the substrate 100 out of the trench, is not removed before Step S222, then in Step S222, the dielectric layer 121 on the trench sidewall is exposed after the protective layer 130 on the trench sidewall is removed. T this time, the dielectric layer 121 is further etched till the trench sidewall is exposed.

In the above example, after a protective layer is formed, the protective layer on the sidewall is removed and the protective layer 130 covering the gate structure 120 is retained to expose the trench sidewall above the gate structure 120. In another example, the protective layer 130 may be only deposited in a target region by a patterning deposition technique. For example, the protective layer 130 is only deposited on the gate structure 120 and on the structural surface out of the trench but not deposited on the trench sidewall above the gate structure 120, such that the trench sidewall above the gate structure 120 retain being exposed. In still another example, the protective layer may also be fully filled in the trench above the gate structure 120, then the protective layer is back-etched to reduce its height, and a part of protective layer on the top of the trench is removed. As shown in FIG. 5*a*, only a part of the protective layer is retained to cover the gate structure.

In Step S300: an epitaxial layer is grown on the exposed trench sidewall with an epitaxial growth process, which does not close the trench.

Figure 4F:
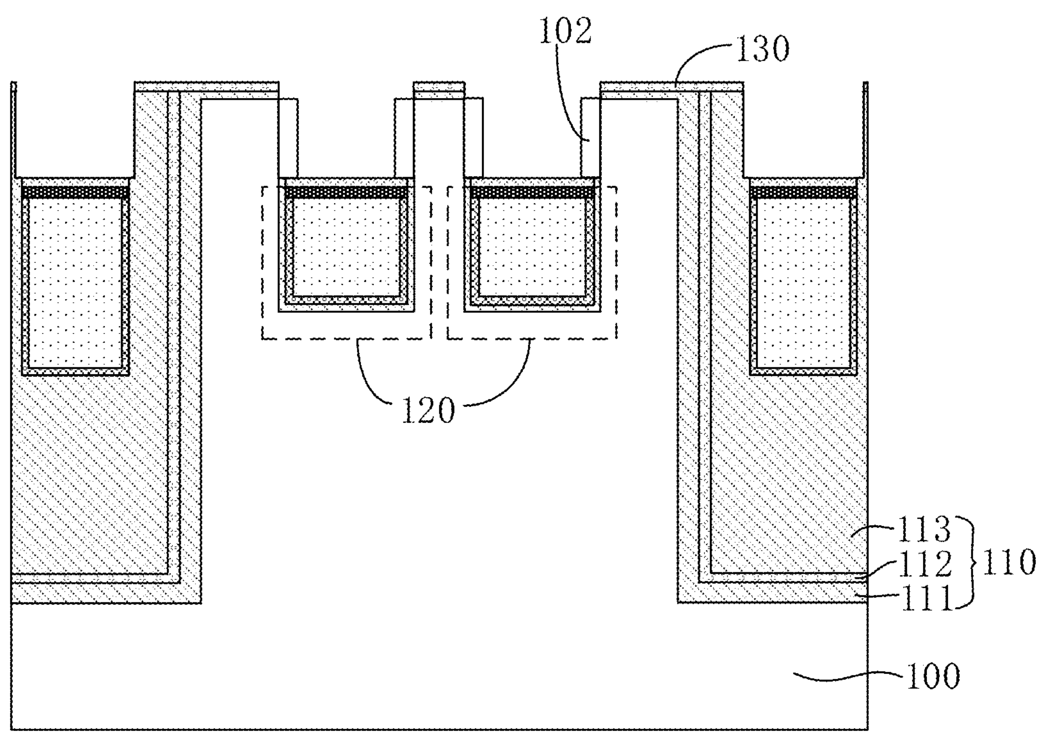

As shown in FIG. 4*f*, the epitaxial layer 102 is grown on the exposed trench sidewall with the epitaxial growth process, and the epitaxial layer 102 does not close the trench, i.e., the epitaxial layer 102 on each of the two sides of the trench does not contact with one another. The grown epitaxial layer 102 is the same as the substrate 100 in property thus it may be taken as a part of the substrate 100. The thickness of the epitaxial layer 102 may be specifically set as required. The thickness of the epitaxial layer 102 can be controlled by controlling the time or condition for the epitaxial growth. Specifically, the trench provided on the active region of the substrate 100 has a width in a range of 5 nm to 50 nm, and each epitaxial layer 102 has a width in a range of 0.1 nm to 20 nm.

Figure 5B:
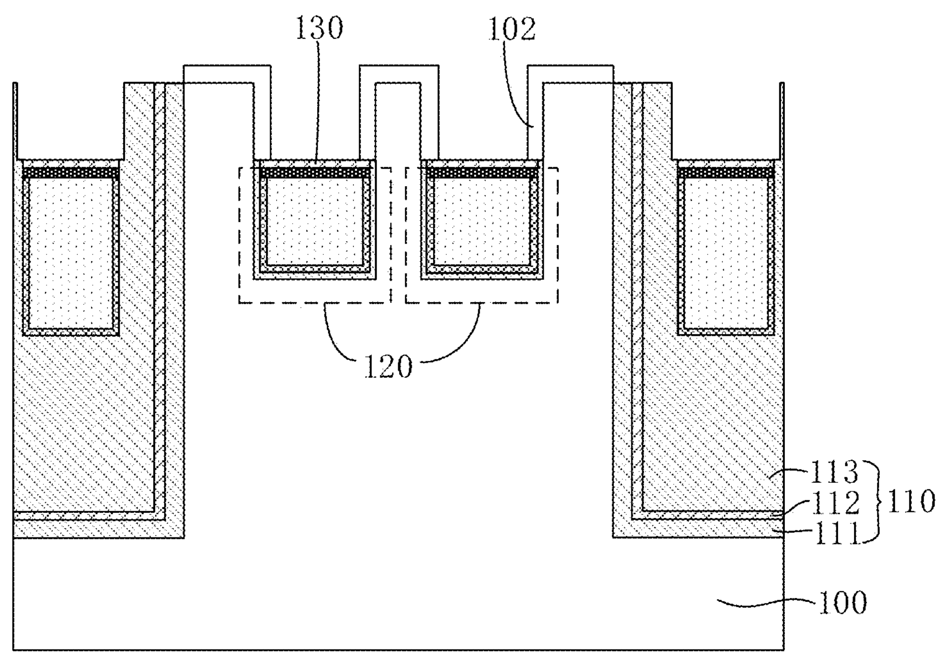
Figure 5C:
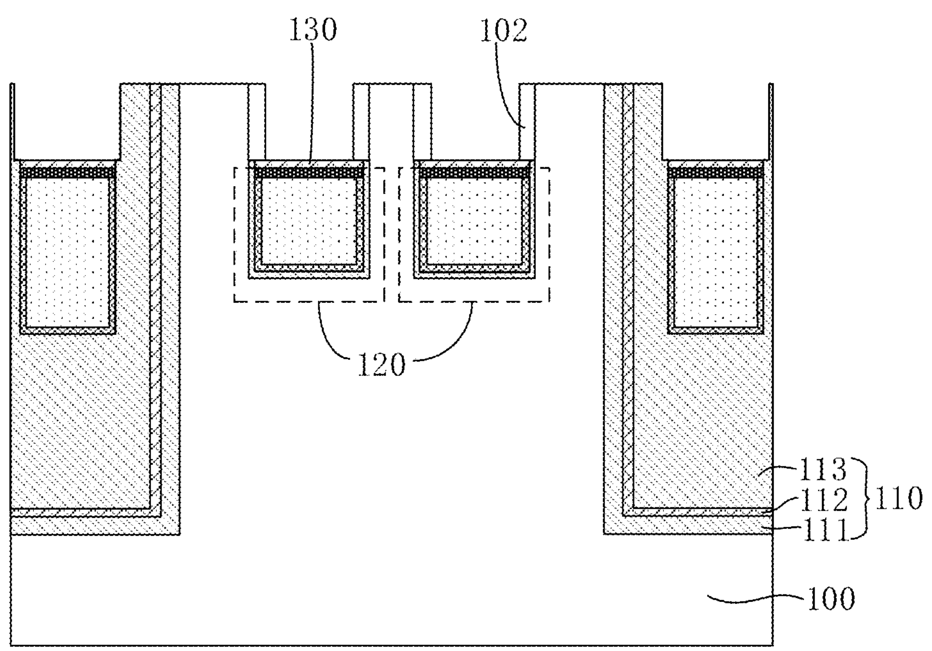

In an example, as shown in FIG. 4*f*, when the protective layer 130 is formed on the surface of each of the gate structure 120 and the substrate out of the trench, the epitaxial growth is only performed on the exposed trench sidewall, i.e., the epitaxial layer 102 is only formed on the trench sidewall. In an example, as shown in FIG. 5*b*, when the protective layer 130 only covers the gate structure 120, the epitaxial growth may be performed on the exposed trench sidewalls and on the substrate out of the trench. At this time, the epitaxial layer 102 is respectively formed on the trench sidewall and on the substrate out of the trench. In combination with FIG. 5*c*, after the epitaxial growth, the undesired epitaxial layer out of the trench may be removed with a grinding process, and only the epitaxial layer 102 on the trench sidewall is retained.

In an example, before the epitaxial growth, in-situ cleaning is performed on the exposed surface of the trench sidewall of the substrate 100, to remove impurities on the surface of the substrate 100. Specifically, SiCoNi in-situ precleaning may be performed, and other dry cleaning or separated wet etching may also be used.

In an example, the step that the epitaxial layer 102 is grown on the exposed trench sidewalls with the epitaxial growth process, may include the following steps.

In Step S310: the substrate is dried in an environment at a temperature of 605° C. to 705° C. Specifically, the substrate is placed into an epitaxial growth furnace chamber, and the temperature of the furnace chamber is set at 605° C. to 705° C. to dry the surface of the substrate as well as the inner wall of the furnace chamber, and make the temperature of the substrate uniform.

In Step S320: the temperature is elevated to 840° C. to 860° C. and hydrogen is charged to perform baking. Specifically, the temperature of the furnace chamber is heated to 840° C. to 860° C., and the hydrogen is charged for baking, so as to remove the oxide film on the exposed surface of the trench sidewall of the substrate.

In Step S330: the temperature is lowered to 715° C. to 725° C. and a pressure is lowered to 9 torr to 11 torr, and then epitaxial growth reaction gases are charged for a preset period for the epitaxial growth. Specifically, the temperature in the furnace chamber is lowered to 715° C. to 725° C. and the pressure is lowered to 9 torr to 11 torr, and then the epitaxial growth reaction gases are charged. The reaction gases may be a combination of $SiH_4$, HCl and hydrogen, a combination of $SiCl_4$ and hydrogen or a combination of $SiHCl_3$ and hydrogen. During the epitaxial growth, the residual reaction gases and reaction product gases need to be pumped out continuously.

In Step S340: the pressure is restored to a barometric pressure, and the temperature is restored to 605° C. to 705° C., to complete the epitaxial growth.

Upon the formation of the epitaxial layer, the trench further needs to be filled with the dielectric, and thus Step S400 is performed.

In Step S400: an isolation layer is filled in the trench.

Figure 4G:
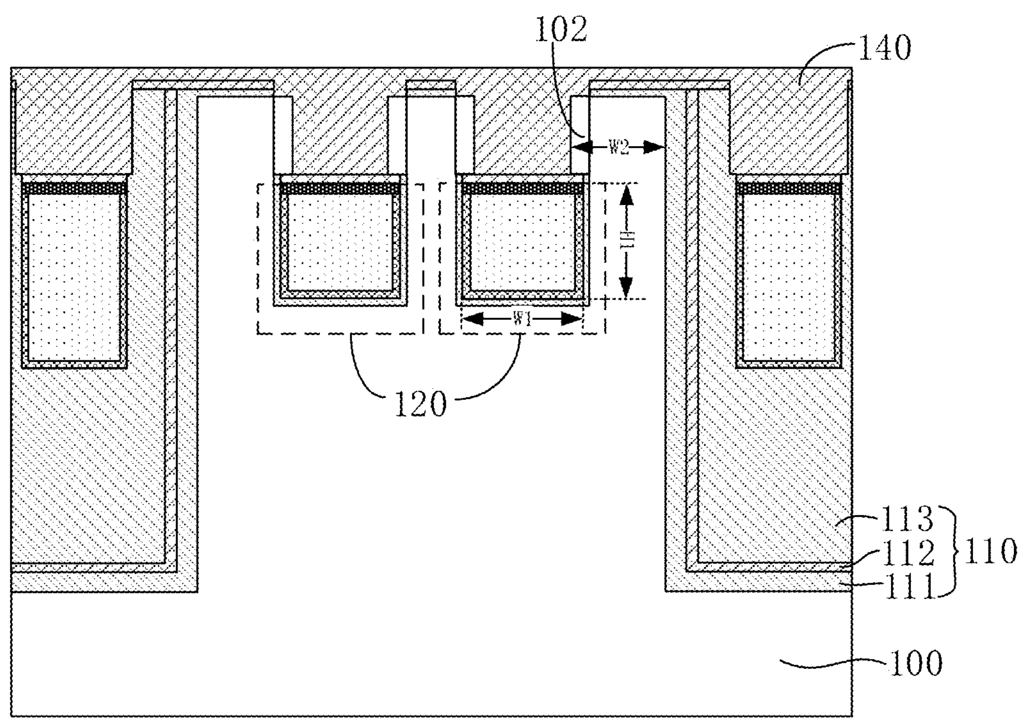

As shown in FIG. 4*g*, the isolation layer 140 is filled in the trench; and specifically, the isolation layer 140 may be deposited with the deposition process. Specifically, the isolation layer 140 may be an oxide layer or a nitride layer.

According to the above method for manufacturing the buried gate, the trench is provided on the substrate 100, the gate structure 120 is filled in the bottom of the trench and the trench sidewall above the gate structure 120 is exposed, and the epitaxial layer 102 is grown on the exposed trench sidewall with the epitaxial growth technique. In the disclosure, the trench having an opening with a large width may be first provided on the substrate 100, in which the gate structure 120 is filled. The large width of the opening of the trench is beneficial to filling the gate structure 120. After the gate structure 120 is filled, the epitaxial layer 102 is grown on the top trench sidewall with the epitaxial growth technique to reduce the width of the opening of the trench, thereby ensuring the width W2 of the active region. Comparisons may be made on FIG. 1 and FIG. 4*g*. The buried gate formed according to the conventional art is shown in FIG. 1, in which the gate conductive layer has the width W1' and the height H1', and an active region on one side of the trench has the width W2'. The buried gate formed according to the disclosure is shown in FIG. 4g, in which the gate conductive layer has the width W1 and the height H1, and an active region on the same side of the trench has the width W2. When the size of the selected substrate is unchanged, the height of the gate conductive layer is unchanged and the size of the active region is unchanged, i.e., H1=H1', W2=W2', the width of the gate structure formed by the disclosure is increased, and the width of the gate conductive layer is also correspondingly increased, i.e., W1>W1'. Therefore, for the buried gate formed by the manufacturing method of the disclosure, the resistance of the gate conductive layer is reduced, such that the buried gate has a good electrical performance.

The disclosure further relates to a method for manufacturing a semiconductor device. The method may include steps in which a gate structure is manufactured on a substrate by any of the above methods for manufacturing the buried gate; and an active region on two sides of the gate structure is doped to form a source/drain region, thus a transistor is produced, thereby forming the semiconductor device including the transistor structure. Therefore, any semiconductor device including the transistor structure may be manufactured with the above manufacturing method. For example, the above semiconductor device may be a laterally-diffused metal-oxide semiconductor (LDMOS), or a vertically-diffused metal-oxide semiconductor (LDMOS). In an example, the above semiconductor device is a dynamic random access memory (DRAM) including a transistor structure, which is provided with a word line and a bit line. The word line is connected to the above formed gate structure 120, and the bit line is connected to a drain of the transistor; and a source of the transistor is connected to a storage capacitor. An on-off state of the corresponding transistor is controlled through the word line, thereby controlling a voltage of the source and changing a charge-discharge state of the storage capacitor to implement data storage.

According to the above method for manufacturing the semiconductor device, as the gate structure is formed with the improved method for manufacturing the buried gate, the gate conductive layer of the formed gate structure has a larger width and the gate conductive layer has a smaller resistance, without changing the level of integration of the device, such that the semiconductor device has the good electrical performance.

The above examples only describe several implementation modes of the disclosure. The description is specific and detailed, but cannot be understood as a limit to a scope of the disclosure accordingly. It should be pointed out that those of ordinary skill in the art may further make multiple changes and improvements without departing from a concept of the disclosure and those also belong to the protection scope of the disclosure. Therefore, the protection scope of the disclosure shall be subjected to the appended claims.

The invention claimed is:

1. A method for manufacturing a buried gate, comprising:

providing a trench on an active region of a substrate;

filling a gate structure in a bottom of the trench, and exposing a trench sidewall above the gate structure;

forming a protective layer covering the trench sidewall, an upper surface of the gate structure and an upper surface of the substrate out of the trench;

removing the protective layer on the trench sidewall and retaining the protective layer on the upper surface of the gate structure with an etching process, and exposing the trench sidewall above the gate structure;

growing an epitaxial layer on the exposed trench sidewall with an epitaxial growth process, wherein the epitaxial layer does not close the trench; and filling an isolation layer in the trench.

2. The method for manufacturing the buried gate of claim 1, wherein filling the gate structure in the bottom of the trench comprises:

forming a dielectric layer on an inner wall of the trench; and filling a first conductive layer in the trench, and back-etching the first conductive layer to a preset depth.

3. The method for manufacturing the buried gate of claim 2, wherein the first conductive layer is metal;

wherein before filling the first conductive layer in the trench, the method further comprises:

forming a metal nitride layer on the dielectric layer; and wherein after filling the first conductive layer in the trench, the method further comprises:

back-etching the first conductive layer and the metal nitride layer to the preset depth.

4. The method for manufacturing the buried gate of claim 2, wherein the first conductive layer is metal; and wherein after back-etching the first conductive layer to the preset depth, the method further comprises:

forming a polysilicon layer covering the first conductive layer in the trench, the polysilicon layer not fully filling the trench.

5. The method for manufacturing the buried gate of claim 2, further comprising filling a second dielectric layer in an isolation trench on the substrate to form an isolation structure, such that adjacent active regions are electrically isolated by the isolation structure.

6. The method for manufacturing the buried gate of claim 5, wherein when the trench is provided on the active region, a second trench is also correspondingly provided on the isolation structure, and when the trench on the active region is filled, the second trench on the isolation structure is also filled by utilizing same steps.

7. The method for manufacturing the buried gate of claim 5, wherein when a metal nitride layer is further formed on the dielectric layer, after the first conductive layer is filled, the first conductive layer and the metal nitride layer are both back-etched to the preset depth, such that upper surfaces of the first conductive layer and the metal nitride layer are flush.

8. The method for manufacturing the buried gate of claim 7, wherein after the first conductive layer is back-etched, the dielectric layer is also continuously back-etched to the preset depth, to remove the dielectric layer out of the gate structure.

9. The method for manufacturing the buried gate of claim 7, wherein after the first conductive layer is back-etched, the dielectric layer is not back-etched, and the dielectric layer is retained on the trench sidewall above the gate structure and on a surface of the substrate out of the trench.

10. The method for manufacturing the buried gate of claim 2, wherein back-etching the first conductive layer comprises:

grinding the first conductive layer by a grinding process to remove the first conductive layer out of the trench, and then etching the first conductive layer in the trench to the preset depth with a dry etching process.

11. The method for manufacturing the buried gate of claim 1, wherein forming the protective layer covering the trench sidewall, the upper surface of the gate structure and the upper surface of the substrate out of the trench comprises: forming the protective layer covering the trench sidewall, the upper surface of the gate structure and the upper surface of the substrate out of the trench with an atomic layer deposition (ALD) process; and wherein the etching process is lateral etching.

12. The method for manufacturing the buried gate of claim 11, wherein when the protective layer is formed on the upper surface of the gate structure and the substrate out of the trench, an epitaxial growth is only performed on the exposed trench sidewall, as such the epitaxial layer is only formed on the trench sidewall.

13. The method for manufacturing the buried gate of claim 11, wherein when the protective layer only covers the gate structure, an epitaxial growth is performed both on the exposed trench sidewall and on the substrate out of the trench, and the epitaxial layer is respectively formed on the trench sidewall and on the substrate out of the trench.

14. The method for manufacturing the buried gate of claim 1, wherein before growing the epitaxial layer on the exposed trench sidewall with the epitaxial growth process, the method further comprises: performing in-situ precleaning on the exposed trench sidewall.

15. The method for manufacturing the buried gate of claim 1, wherein the trench provided on the active region of the substrate has a width in a range of 5 nm to 50 nm, and the epitaxial layer has a width in a range of 0.1 nm to 20 nm.

16. The method for manufacturing the buried gate of claim 1, wherein growing the epitaxial layer on the exposed trench sidewall with the epitaxial growth process comprises:

drying the substrate in an environment at a temperature of 605° C. to 705° C.;

baking the substrate by elevating the temperature to 840° C. to 860° C. and charging hydrogen;

performing the epitaxial growth process for a preset period after lowering the temperature to 715° C. to 725° C. and lowering a pressure to 9 torr to 11 torr, and then charging epitaxial growth reaction gases;

restoring the pressure to a barometric pressure, and restoring the temperature to 605° C. to 705° C., to complete the epitaxial growth process; and filling the isolation layer in the trench.

17. The method for manufacturing the buried gate of claim 1, wherein a material of the protective layer is silicon nitride or silicon oxide.

18. A method for manufacturing a semiconductor device, comprising:

manufacturing the gate structure on the substrate according to the method for manufacturing the buried gate of claim 1; and doping the active region on each of two sides of the gate structure to form a source/drain region.

19. The method for manufacturing the semiconductor device of claim 18, wherein the semiconductor device is a dynamic random access memory (DRAM).

20. A method for manufacturing a buried gate, comprising:

providing a trench on an active region of a substrate;

filling a gate structure in a bottom of the trench, and exposing a trench sidewall above the gate structure, which comprises:

forming a dielectric layer on an inner wall of the trench; and filling a first conductive layer in the trench, and back-etching the first conductive layer to a preset depth;

growing an epitaxial layer on the exposed trench sidewall with an epitaxial growth process, wherein the epitaxial layer does not close the trench; and filling an isolation layer in the trench, wherein the first conductive layer is metal; and wherein after back-etching the first conductive layer to the preset depth, the method further comprises:

forming a polysilicon layer covering the first conductive layer in the trench, the polysilicon layer not fully filling the trench.

* * * * *